US010852620B2

(12) United States Patent
Lam et al.

(10) Patent No.: US 10,852,620 B2
(45) Date of Patent: Dec. 1, 2020

(54) CONTINUOUS-WAVE TERAHERTZ GENERATION VIA OPTICALLY PUMPED RYDBERG STATES

(71) Applicant: National University of Singapore, Singapore (SG)

(72) Inventors: Mun Choong Mark Lam, Singapore (SG); Sambit Bikas Pal, Singapore (SG); Wenhui Li, Singapore (SG); Christian Wolfgang Ernst Gross, Singapore (SG); Thibault Thomas Vogt, Singapore (SG)

(73) Assignee: National University of Singapore, Singapore (SG)

( * ) Notice: Subject to any disclaimer, the term of this patent is extended or adjusted under 35 U.S.C. 154(b) by 0 days.

(21) Appl. No.: 16/405,529

(22) Filed: May 7, 2019

(65) Prior Publication Data

US 2019/0339586 A1 Nov. 7, 2019

(30) Foreign Application Priority Data

May 7, 2018 (SG) .......................... 10201803836X

(51) Int. Cl.
*G02F 1/35* (2006.01)
*H01S 5/14* (2006.01)
(52) U.S. Cl.
CPC .............. *G02F 1/353* (2013.01); *H01S 5/146* (2013.01); *G02F 2203/13* (2013.01)
(58) Field of Classification Search
USPC .................................. 250/493.1, 504 R, 251
See application file for complete search history.

(56) References Cited

U.S. PATENT DOCUMENTS 5,771,117 A * 6/1998 Harris ..................... G02F 1/353
359/326
7,672,342 B2 3/2010 Gohle et al.
(Continued)

FOREIGN PATENT DOCUMENTS

WO WO-2017-109475 A1 6/2017

OTHER PUBLICATIONS

Akulshin, Alexander M., et al., "Amplified Spontaneous Emission At 5.23 μm in Two-Photon Excited Rubidium Vapor," The Optical Society, Journal of the Optical Society of America B, vol. 34, Issue 12, Nov. 8, 2017, pp. 1-7.
(Continued)

*Primary Examiner* — Kiet T Nguyen
(74) *Attorney, Agent, or Firm* — Cesari and McKenna, LLP; James A. Blanchette

(57) ABSTRACT

In example embodiments, a radiation source uses Rydberg states to generate coherent THz radiation (e.g., in the range of 1-20 THz). The radiation source includes a pair of pump lasers (e.g., external-cavity diode lasers (ECDLs)) optically coupled (e.g., by a dichroic mirror and optical fiber) to a heated vapor cell (e.g., a vacuum chamber) holding an atomic species (e.g., rubidium (Rb)). The pump lasers optically pump the atomic species (e.g., Rb) to a predetermined Rydberg state (e.g., the $nD_{5/2}$ state), which creates a population inversion between that state (e.g., the $nD_{5/2}$ state) and a lower lying Rydberg state (e.g., the $(n+1)P_{3/2}$ state). The emission between these two strongly dipole coupled Rydberg states generates coherent THz radiation.

20 Claims, 6 Drawing Sheets

(56) References Cited

U.S. PATENT DOCUMENTS

| | | |
|---|---|---|
| 9,337,669 B2 | 6/2016 | Boda et al. |
| 2004/0017833 A1* | 1/2004 | Cundiff .................. H01S 3/1112 372/18 |
| 2009/0074016 A1 | 3/2009 | Marner et al. |

OTHER PUBLICATIONS

Akulshin, Alexander et. al., Directional Infrared Emission Resulting from Cascade Population Inversion and Four-Wave Mixing in Rb Vapor, Optics Letters, vol. 39, Feb. 2014, pp. 1-4.

Dhillon, S.S., et. al., "The 2017 Terahertz Science and Technology Roadmap," IOP Publishing, Ltd., IOP Science, Journal of Physics D: Applied Physics, vol. 50, No. 4, Jan. 4, 2017, pp. 1-49.

Grimes, David, et al., "Direct Single-Shot Observation of Millimeter-Wave Superradiance in Rydberg-Rydberg Transitions," American Physical Society, Physical Review A, vol. 95, Apr. 12, 2017, pp. 1-8.

Kiffner, Martin, et al., "Two-Way Interconversion of Millimeter-Wave and Optical Fields in Rydberg Gases," IOP Publishing Ltd and Deutsche Physilcalische Gesellschaft, New Journal of Physics, vol. 18, Sep. 15, 2016, pp. 1-13.

Keinlen, Marcus B., et al., "Collimated Blue Light Generation in Rubidium Vapor," Pacific University CommonKnowledge, All CAS Faculty Scholarship, American Journal of Physics, vol. 81, No. 6, Jun. 2013, pp. 442-449.

Sebbag, Yoel. Et al., "Generation of Coherent Mid-IR Light by Parametric Four-Wave Mixing in Alkali Vapor," Optical Society of America, Optics Letters, vol. 44, No. 4, Feb. 15, 2019, pp. 971-975.

Sun, Xuan, et al., "Terahertz Radiation in Alkali Vapor Plasmas," AIP Publishing LLC, Applied Physics Letters, vol. 104, Issue 19, May 13, 2014, pp. 1-4.

Vernier, et. al., "Enhanced Frequency Up-Conversion in Rb Vapor," Optical Society of America, The Optical Society, Optics Express, vol. 18, Issue 16, Jul. 27, 2010, pp. 1-7.

Zhong, Kai, et. al., "Optically Pumped Terahertz Sources," Science China Press amd Springer-Verlag GmbH Germany, Science China Technological Sciences, vol. 60, No. 12, Dec. 2017, pp. 1801-1818.

Zhou, Zhaoyan, et al., "Terahertz Emission of Atoms Driven by Ultrashort Laser Pulses," American Physical Society, Physical Review A, vol. 79, Issue 6, Jun. 2009, one page.

* cited by examiner

FIG. 2

| THz Generation Transition | Pump Laser 1 | Pump Laser 2 | Generated THz Radiation | Generated UV Wavelength |
|---|---|---|---|---|
| $10D_{5/2} \rightarrow 11P_{3/2}$ | 780.2nm | 515.1nm | 3.28 THz | 311.3nm |
| $9D_{5/2} \rightarrow 10P_{3/2}$ | 780.2nm | 526.1nm | 4.84 THz | 315.8nm |
| $8D_{5/2} \rightarrow 9P_{3/2}$ | 780.2nm | 543.3nm | 7.55 THz | 322.9nm |
| $7D_{5/2} \rightarrow 8P_{3/2}$ | 780.2nm | 572.6nm | 12.81 THz | 334.9nm |

US 10,852,620 B2

CONTINUOUS-WAVE TERAHERTZ GENERATION VIA OPTICALLY PUMPED RYDBERG STATES

RELATED APPLICATIONS

The present application claims priority to Singapore Patent Application No. 10201803836X, filed by Applicant National University of Singapore on May 7, 2018, the contents of which are incorporated by reference herein in their entirety.

BACKGROUND

Technical Field

The present disclosure relates generally to radiation generation and more specifically to techniques for generation of coherent terahertz (THz) radiation

Background Information

THz band (the frequency range from 0.1-30 THz) radiation may have many commercial applications, for example, in security scanning, non-destructive polymer/plastic testing, non-destructive testing in food-processing, soft-tissue biological sample imaging, quality-control of pharmaceutical products, and other types of testing, imaging or scanning. As such, there have been intensive research activities to develop sources of coherent, high-power radiation in the THz band. However, compact, narrow-linewidth, and high-power THz sources are still lacking, especially in the range of 5-15 THz which overlaps the THz band, despite tremendous advancements in technologies such as quantum cascade lasers, optically pumped lasers, and difference-frequency generation techniques. The root of this challenge lies in the difficulty of finding suitable media that can efficiently provide strong electric dipole oscillators (be that classical or quantum) in this frequency range.

Accordingly, there is a need for a new type of radiation source that may generate coherent, high power THz radiation.

SUMMARY

In example embodiments, a radiation source uses Rydberg states to generate coherent THz radiation (e.g., in the range of substantially 1-20 THz). The radiation source includes a pair of pump lasers (e.g., external-cavity diode lasers (ECDLs)) optically coupled (e.g., by a dichroic mirror and optical fiber) to a heated vapor cell (e.g., a vacuum chamber) holding an atomic species (e.g., rubidium (Rb)). The pump lasers optically pump the atomic species (e.g., Rb) to a predetermined Rydberg state (e.g., the $nD_{5/2}$ state), which creates a population inversion between that state (e.g., the $nD_{5/2}$ state) and a lower lying Rydberg state (e.g., the $(n+1)P_{3/2}$ state). The emission between these two strongly dipole coupled Rydberg states generates coherent THz radiation.

It should be understood that a variety of additional features and alternative embodiments may be implemented other than those discussed in this Summary. This Summary is intended simply as a brief introduction to the reader, and does not indicate or imply that the examples mentioned herein cover all aspects of the disclosure, or are necessary or essential aspects of the disclosure.

BRIEF DESCRIPTION OF THE DRAWINGS

The description below refers to the accompanying drawings of example embodiments, of which:

FIG. 2 is a table listing examples of Rydberg state transitions for Rb atoms, and frequencies of generated THz radiation and deep-UV laser light for other pump laser frequencies;

DETAILED DESCRIPTION

Definitions

As used herein, the term "Terahertz band" or "THz band" should be understood to refer to the frequency range from 0.1-30 THz. Certain embodiments described herein may generate THz radiation that overlaps at least a portion of the THz band.

As used herein, the term "and/or" (e.g., as in "X and/or Y") should be interpreted to mean either "and" or "or" (e.g., as in "X and Y" or "X or Y").

Further, as used herein, the term "substantially" should be understood to include, exactly or completely, and also to include within a reasonable variation, defined as a variation of no more than +/−5% when used in reference to a value.

Example Embodiments

An example radiation source uses Rydberg states to generate coherent THz radiation. A Rydberg state is a state of an atomic species in which one of the electrons has been excited to a high principal quantum number n, typically 10 or higher. Often, such a state corresponds to putting an electron into an orbit whose dimensions are very large compared to the size of the ion core. Among the novel properties of Rydberg states are extreme sensitivity to external influences such as fields and collisions, and extreme reactivity. The energy gaps between adjacent Rydberg states (scaling as $\sim 1/n^3$) are typically in the range of THz frequencies for $n \leq 20$, and these states are strongly coupled to electromagnetic fields due to their large electric dipole moments (scaling as $\sim n^2$).

Figure 1:
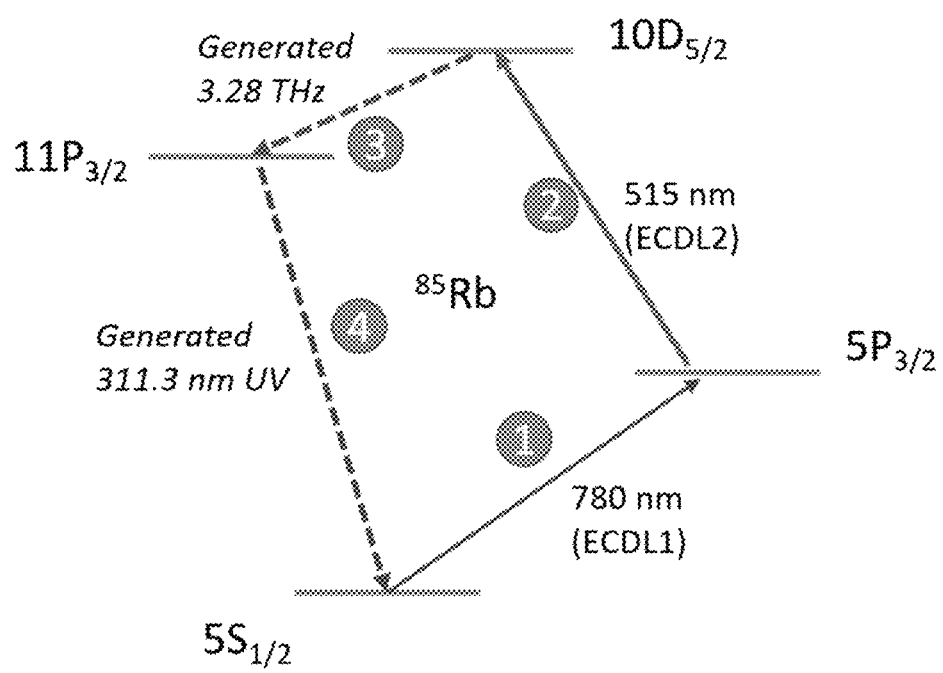
FIG. 1 is a diagram of example Rydberg states of a Rb atom.

FIG. 1 is a diagram of Rydberg states of a Rb atom. The Rydberg states include the $10D_{5/2}$ state and $11P_{3/2}$ state. As explained below, an atomic species such as Rb in a heated vapor cell (e.g., a vacuum chamber) may be optically pumped by a pair of pump lasers (e.g., ECDLs, such as the 780 nm ECDL and a 515 nm ECDL shown) to a predetermined Rydberg state (e.g., the $nD_{5/2}$ state, such as the $10D_{5/2}$ state shown), for example, via an intermediate state (e.g., the $n'P_{3/2}$ state, such as the $5P_{3/2}$ state shown). Due to the relatively long lifetime of the predetermined Rydberg state (e.g., the $nD_{5/2}$ state, such as the $10D_{5/2}$ state shown), and the highly favorable branching ratio for the state and a lower lying Rydberg state (e.g., the $(n+1)P_{3/2}$ state such as the $11P_{3/2}$ state shown), moderately strong pumping creates a population inversion between the predetermined Rydberg state and the lower lying Rydberg state. This population inversion, together with the large dipole moment, leads to strong emission of coherent THz radiation (e.g., 3.28 THz radiation as shown) corresponding to the level spacing between these two states. At certain detuning's of the frequencies of the pair of pump lasers and large enough atomic species (e.g., Rb) densities, a four-wave mixing process may occur that simultaneously generates coherent THz radiation (e.g., 3.28 THz radiation as shown) as well as a deep-UV laser light (e.g., at 311 nm as shown).

Figure 3:
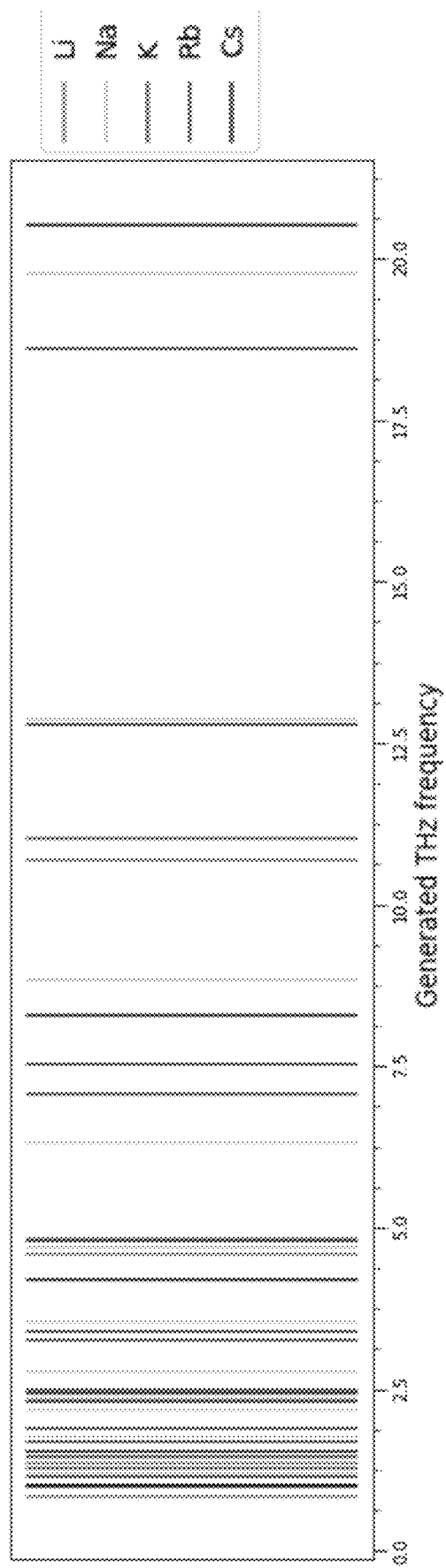
FIG. 3 is a spectrum showing example THz emission lines for the alkali atoms Li, Na, K, Rb and Cs.

Similar techniques may be used to generate THz radiation and deep-UV laser light of other frequencies (e.g., other than 3.28 THz and 311 nm) by changing the frequency of the pump lasers to cause other transitions between Rydberg states. FIG. 2 is a table listing examples of Rydberg state transitions for Rb atoms and frequencies of generated THz radiation and deep-UV laser light for other pump laser frequencies. Likewise, THz radiation and deep-UV laser light of other frequencies may be generated by changing the atomic species (e.g., from Rb to another species, such as alkali atoms of lithium (Li), sodium (Na), potassium (K), Cesium (Cs), etc.). FIG. 3 is a spectrum showing example THz emission lines for the alkali atoms Li, Na, K, Rb and Cs. By utilizing pump lasers capable of multiple frequencies and/or a combination of vapor cells holding different atomic species, it is possible to efficiently generate high-intensity THz radiation at multiple frequencies in the THz band with a single device.

Figure 4:
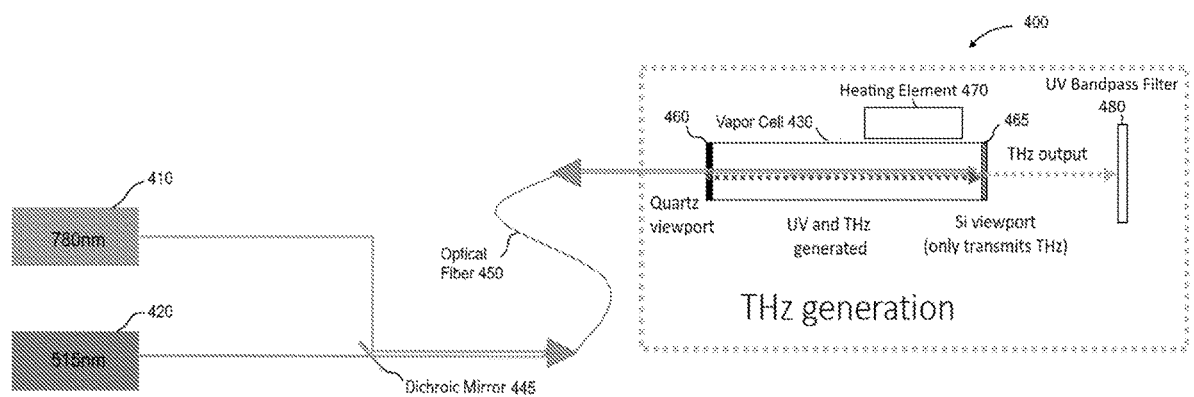
FIG. 4 is a diagram of an example radiation source that utilizes Rydberg states to generate coherent THz radiation.

FIG. 4 is a diagram of an example radiation source 400 that utilizes Rydberg states to generate coherent THz radiation, that may implement the above discussed principles. The radiation source includes a pair of pump lasers (e.g., ECDLs) 410, 420 stabilized to frequencies (e.g., stabilized to 780 nm and 515 nm) that cause a Rydberg state transition as described above. Frequencies of the pair of pump lasers 410, 420 may be adjusted within a small range (e.g., ±2 GHz) from their respective atomic resonance frequencies to maximize the generated THz radiation.

The pair of pump lasers 410, 420 may be optically coupled to a vapor cell 430 by beam-shaping and beam-steering optics to ensure good spatial overlap of the two laser beams. The optics may include a dichroic mirror 445 and optical fiber 450 capable of propagating a single-transverse mode for both the pump lasers 410, 420 to ensure spatial overlap. An achromatic lens (not shown) of suitable focal length may be used to focus the spatially overlapped beams into the vapor cell 430 (e.g., with a beam waist of a few hundred microns and with a Rayleigh range on the order of the length of the vapor cell 430). The vapor cell 430 may be a leak-proof vacuum chamber that is first evacuated and subsequently either filled with species vapor (e.g., Rb vapor) or with a species dispenser (e.g., a Rb dispenser). To attain sufficiently high vapor density, the vapor cell 430 may be heated and maintained above room temperature (e.g., at a temperature in the range of 110° C. to 120° C.) by a heating element 470. The vapor cell 430 includes two viewports 460, 465 along a common axis. A first viewport 460 for receiving the laser light from the pump lasers 410, 420 is transparent to visible and near-infrared radiation. The first viewport 460 may be constructed of quartz, or another material that has these properties. A second viewport 465 for passing the THz radiation is transparent to THz frequency radiation, but may be opaque to UV light. The second viewport 465 may be constructed of silicon, or another material that has these properties. Additional viewports may be present to allow monitoring and diagnostics of the radiation source 400. The THz radiation produced by the radiation source 400 may be passed to any of a number of devices, when used in a commercial deployment. For testing purposes, the THz radiation may be passed to a THz bolometer that detects and quantifies the generated THz radiation or a scanning Fabry-Perot interferometer that characterizes spectral purity of the generated THz radiation.

The operation of a radiation source that utilizes Rydberg states to generate coherent THz radiation may be tested directly (e.g., by measuring generated THz radiation) or indirectly (e.g., by measuring generated UV light produced along with the THz radiation). In an indirect testing scenario, the above described vapor cell 430 may be substituted with a commercially available fused-silica vapor cell that has walls that are highly absorptive to THz frequencies but transparent to UV light. A UV bandpass filter 480 may be placed downstream of the vapor cell to remove unabsorbed lights from the pump lasers 410, 420 and allow the generated UV light to pass through. In such a configuration, successful THz generation may be indirectly detected by the presence of a collimated UV beam output from the UV bandpass filter 480. This collimated UV beam is only possible via a parametric four-wave mixing process with the presence of coherent THz radiation.

Figure 5:
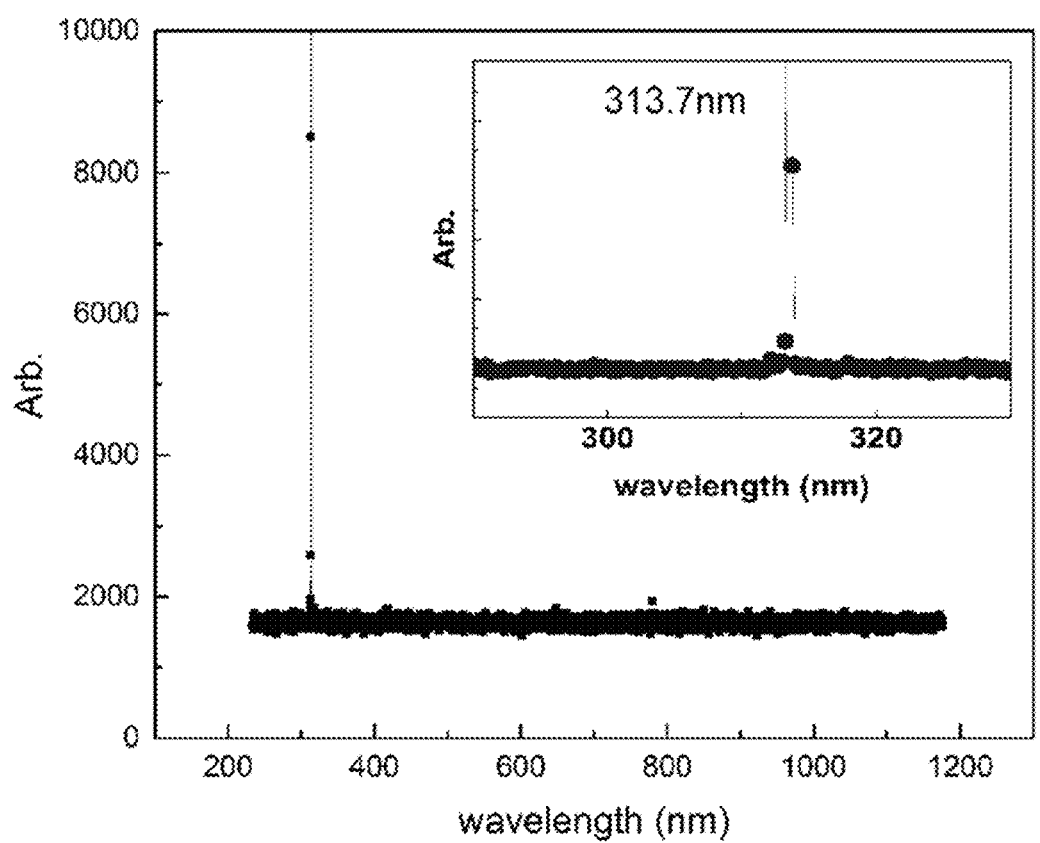
FIG. 5 is a spectrum of a generated collimated UV beam resulting from example indirect testing, with an insert showing a zoomed in region of the spectrum.
Figure 6:
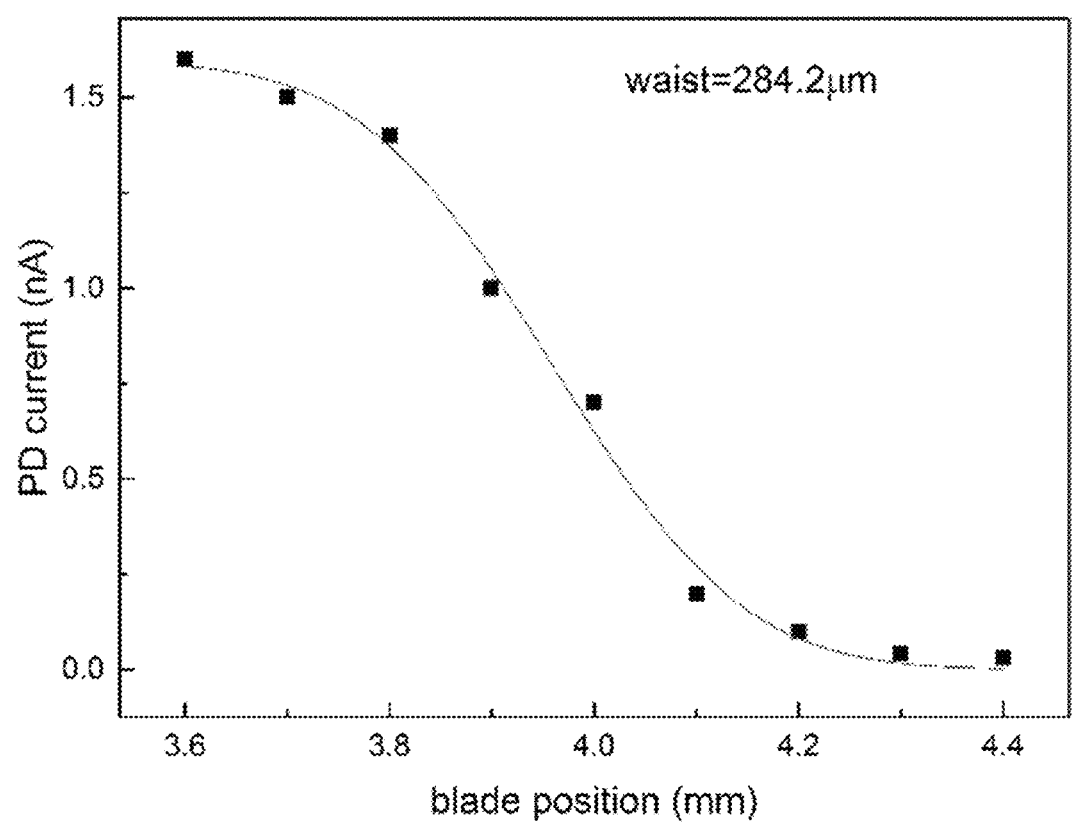
FIG. 6 is a beam profile measurement of generated UV light in example indirect testing.

FIG. 5 is a spectrum of a generated collimated UV beam resulting from example indirect testing, with an insert showing a zoomed in region of the spectrum. It may be verified that the UV beam in FIG. 5. is a collimated Gaussian beam as expected of the parametric mixing process and not from spontaneous emission by measuring its spatial characteristics. FIG. 6 is a beam profile measurement of generated UV light in example indirect testing, demonstrating its collimated nature. A narrow beam waist which closely matches the waists of the input beam is observed, as expected from a parametric mixing process.

A radiation source that uses Rydberg states to generate coherent THz radiation (e.g., in the range of substantially 1-20 THz) may have applications in a variety of fields, for example, security scanning, non-destructive polymer/plastic, testing non-destructive testing in food-processing, soft-tissue biological sample imaging, quality-control of pharmaceutical products, and other types of testing, imaging or scanning. Such a radiation source may have a number of advantages over prior attempts and competing technologies. For example, such a radiation source may operate in a wide range (e.g., substantially 1-20 THz) including the previously unavailable range of 5-15 THz. By utilizing pump lasers capable of multiple frequencies and/or a combination of vapor cells holding different atomic species, it is even possible to generate THz radiation at multiple frequencies with a single device. Further, such a radiation source may produce coherent continuous-wave THz radiation. Continuous-wave THz radiation may be highly beneficial for THz imaging applications. The radiation source may use media (e.g., Rb vapor) that can operate at or above room-temperature (e.g., 110° C. to 120° C.). As such, bulky and expensive cryogenic equipment is unnecessary. Still further, such a radiation source may use compact, commercially-available pump sources (e.g. ECDLs), rather than more bulky or exotic devices.

It should be understood that various adaptations and modifications may be made to the above-discussed designs. Various elements described above may be made from differing materials, substituted for different elements, implemented in different combinations or otherwise arranged or used differently without departing from the intended scope of the disclosure. Example embodiments are not necessarily mutually exclusive as some may be combined with one or more others to form new example embodiments. Figures are not drawn to scale and relative relationships in size may be exaggerated for clarity in presentation. The example embodiments are, therefore, to be considered in all respects to be illustrative and not restrictive. What is claimed is:

The invention claimed is:
1. A radiation source comprising:
a vapor cell holding an atomic species; and
one or more pump lasers optically coupled to the vapor cell, the one or more pump lasers configured to optically pump the atomic species in the vapor cell to a predetermined Rydberg state to yield a population inversion between the predetermined Rydberg state and a lower lying Rydberg state and an emission of coherent terahertz (THz) radiation.
2. The radiation source of claim 1, wherein the atomic species is rubidium (Rb).
3. The radiation source of claim 1, wherein the atomic species is one of lithium (Li), sodium (Na), potassium (K) or Cesium (Cs).
4. The radiation source of claim 1, wherein the one or more pump lasers are a pair of external-cavity diode lasers (ECDLs).
5. The radiation source of claim 1, wherein the predetermined Rydberg state is a $nD_{5/2}$ state and the lower lying Rydberg state is a $(n+1)P_{3/2}$ state, where n is principal quantum number.
6. The radiation source of claim 5, wherein the $nD_{5/2}$ state is a $10D_{5/2}$ state and the $(n+1)P_{3/2}$ state is a $11P_{3/2}$ state.
7. The radiation source of claim 5, wherein the atomic species is rubidium (Rb) and the one or more pump lasers include a 780 nm laser and a 515 nm laser that when activated optically pump the Rb in the $nD_{5/2}$ state to yield a population inversion between the $nD_{5/2}$ and the $(n+1)P_{3/2}$ state and the emission of coherent THz radiation.
8. The radiation source of claim 1, further comprising:
an optical fiber configured to propagate a single-transverse mode of light to the vapor cell;
a dichroic mirror configured to direct laser light from the one or more pump lasers to the optical fiber.
9. The radiation source of claim 1, wherein the vapor cell further comprises:
a first viewport configured to receive laser light from the one or more pump lasers and that is transparent to visible and near-infrared radiation;
a second viewport configured to pass THz radiation and that is transparent to THz frequency radiation.
10. The radiation source of claim 1, further comprising:
a heating element configured to heat the atomic species in the vapor cell.
11. The radiation source of claim 1, wherein the THz radiation is between 1-20 THz.
12. The radiation source of claim 1, wherein the THz radiation is between 5-15 THz.
13. A radiation source comprising:
a vapor cell holding at least one of rubidium (Rb), lithium (Li), sodium (Na), potassium (K) or Cesium (Cs) vapor, the vapor cell including a first viewport transparent to receive laser light and a second viewport transparent to terahertz (THz) radiation; and
a pair of pump lasers optically coupled to the first viewport of the vapor cell, the pair of pump lasers configured to optically pump the Rb, Li, Na, K or Cs in the vapor cell to a predetermined Rydberg state to yield a population inversion between the predetermined Rydberg state and a lower lying Rydberg state and an emission of coherent THz radiation from the second viewport.
14. A method for generating radiation, comprising:
maintaining an atomic species in a vapor cell;
optically pumping the atomic species in the vapor cell to a predetermined Rydberg state with one or more lasers; and
in response to the optically pumping, producing a population inversion between the predetermined Rydberg state and a lower lying Rydberg state and an emission of coherent terahertz (THz) radiation.
15. The method of claim 14, wherein the atomic species is rubidium (Rb).
16. The method of claim 14, wherein the atomic species is one of lithium (Li), sodium (Na), potassium (K) or Cesium (Cs).
17. The method of claim 14, wherein the predetermined Rydberg state is a $nD_{5/2}$ state and the lower lying Rydberg state is a $(n+1)P_{3/2}$ state, where n is principal quantum number.
18. The method of claim 17, wherein the atomic species is rubidium (Rb) and the optically pumping include providing 780 nm and 515 nm laser light that produces the population inversion in the Rb in the $nD_{5/2}$ state to the $(n+1)P_{3/2}$ state and the emission of coherent THz radiation.
19. The method of claim 14, wherein the optically pumping further produces UV light, and the method comprises:
filtering the UV light.
20. The method of claim 14, wherein the THz radiation is between 1-20 THz.

* * * * *